United States Patent
Miura

[11] Patent Number: 5,932,917
[45] Date of Patent: Aug. 3, 1999

[54] INPUT PROTECTIVE CIRCUIT HAVING A DIFFUSION RESISTANCE LAYER

[75] Inventor: Hirotomo Miura, Tokyo, Japan

[73] Assignee: Nippon Steel Corporation, Tokyo, Japan

[21] Appl. No.: 08/834,840

[22] Filed: Apr. 10, 1997

[30]   Foreign Application Priority Data

Apr. 19, 1996  [JP]  Japan ................................... 8-122147

[51] Int. Cl.⁶ .................................................. H01L 23/62
[52] U.S. Cl. ......................... 257/358; 257/355; 257/357; 257/360; 257/363
[58] Field of Search ..................................... 257/355, 356, 257/357, 358, 359, 360, 361, 362, 363, 546, 547, 489; 438/527

[56]   References Cited

U.S. PATENT DOCUMENTS 5,477,407  12/1995  Kobayashi et al. ..................... 257/355
5,498,892  3/1996  Walker et al. ........................... 257/350
5,705,441  1/1998  Wang et al. ............................. 438/384
5,777,368  7/1998  Wu et al. ................................ 257/360

FOREIGN PATENT DOCUMENTS 355166953  12/1980  Japan ..................................... 257/355
57-90969   6/1982  Japan .
2247779    3/1992  United Kingdom ................... 257/357

*Primary Examiner*—Tom Thomas
*Assistant Examiner*—Ori Nadav
*Attorney, Agent, or Firm*—Pollock, Vande Sande & Amernick

[57]   ABSTRACT

An input protective circuit includes a resistance element for connecting the input terminal and internal circuit of a semiconductor integrated circuit, and a field effect transistor for discharging a surge input to the ground potential. Adjacent diffusion layer regions consisting of a diffusion resistance layer corresponding to the resistance element and an impurity diffusion layer corresponding to the drain or source of the field effect transistor and connected adjacent to each other are formed by double diffusion using ion implantation.

7 Claims, 12 Drawing Sheets

F I G. 12A
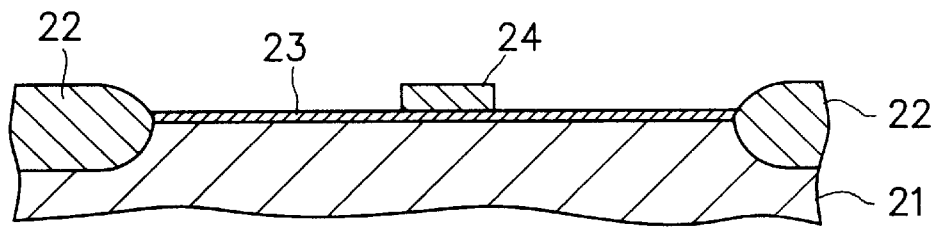
F I G. 12B
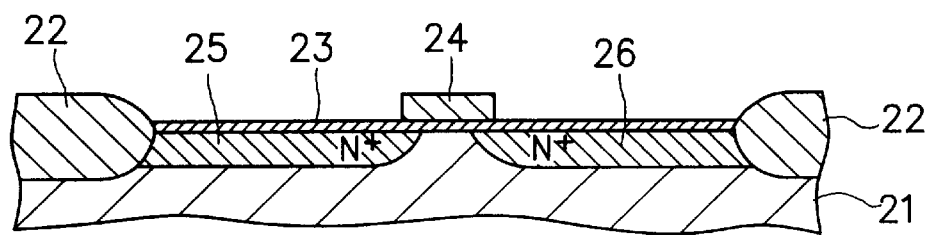
F I G. 12C
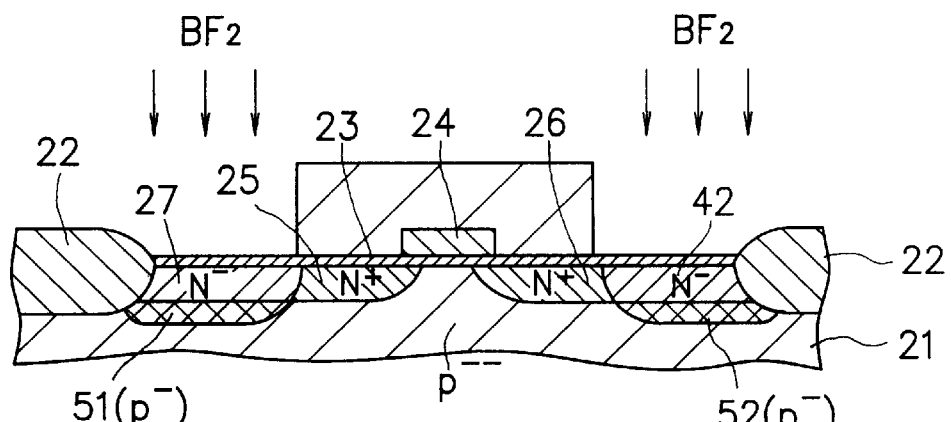
F I G. 12D
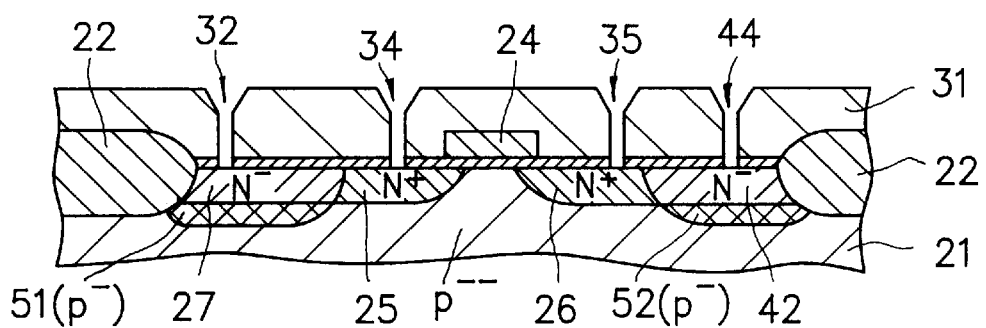

INPUT PROTECTIVE CIRCUIT HAVING A DIFFUSION RESISTANCE LAYER

BACKGROUND OF THE INVENTION

1. Field of the Invention

The present invention relates to a semiconductor device and a method of manufacturing the same, particularly an input protective circuit arranged between an input/output terminal and an internal circuit of a semiconductor integrated circuit or the like and a method of manufacturing the same.

2. Description of the Related Art

In some cases, an excess surge voltage higher than the breakdown voltage of the internal circuit is applied to the input/output terminal of a semiconductor integrated circuit or the like by, e.g., static electricity. If this excess surge voltage is directly applied to the internal circuit, the internal circuit is destroyed. A normal semiconductor integrated circuit has an input protective circuit between the input/output terminal and the internal circuit. With this structure, even when an excess surge voltage is applied to the input/output terminal, application of the surge voltage to the internal circuit can be prevented.

In this input protective circuit, a resistance element is connected to a bonding pad serving as an input/output terminal to which a wire is bonded, and the internal circuit is connected to this resistance element through the wiring layer. The wiring layer is also connected to the drain diffusion layer of an n-channel transistor, and a grounding supply is connected to the source diffusion layer and gate electrode of the transistor through the wiring layer. The input protective circuit is constituted by the resistance element and the transistor.

The transistor of this input protective circuit is not turned on even when a voltage with a predetermined value or less is applied to the bonding pad. Therefore, the current flows from the bonding pad to the internal circuit through the resistance element and the wiring layer.

However, when a voltage with a value larger than the predetermined value is applied to the bonding pad, the peak voltage is lowered by τ=C×R, which is determined by a parasitic capacitance C in the wiring layer and a resistance value R of the resistance element. At the same time, the current flows to the grounding supply through the transistor in which snapback breakdown occurs, thereby lowering the voltage applied to the internal circuit.

In the conventional input protective circuit, however, since an element active region where a pair of $n^+$-type diffusion layers serving as the drain and source of the transistor are formed, and an element active region where an $n^-$-type diffusion layer serving as the resistance element is formed, are separated from each other by a field oxide film as an element isolation structure, a large area is necessary for the input protective circuit due to the area of the field oxide film. Consequently, the semiconductor integrated circuit or the like can hardly be micropatterned.

A structure in which diffusion layers are not separated by a field oxide film is disclosed in, e.g., Japanese Patent Laid-Open No. 57-90969. In Japanese Patent Laid-Open No. 57-90969, a diode is used for the input protective circuit, and a $p^-$-type diffusion layer and a $p^+$-type diffusion layer are formed to overlap each other, thereby raising the electrostatic breakdown voltage. However, since the $p^-$-type diffusion layer and the $p^+$-type diffusion layer are stacked, this structure cannot be used as a resistance element.

SUMMARY OF THE INVENTION

It is an object of the present invention to provide an input protective circuit which requires no large area and allows the micropatterning of semiconductor integrated circuit or the like.

It is another object of the present invention to provide a method of manufacturing an input protective circuit which can manufacture a semiconductor integrated circuit with a small number of processes at a low cost.

It is another object of the present invention to provide a semiconductor device which requires no large area.

It is another object of the present invention to provide a method of manufacturing a semiconductor device which can manufacture with a small number of processes at a low cost.

According to the present invention, there is provided an input protective circuit having a resistance element with one end connected to an input terminal of a semiconductor integrated circuit and the other end connected to an internal circuit, and a field effect transistor consisting of a source and drain for forming a channel between the other end of the resistance element and a reference voltage conductor and a gate covering the channel, comprising a first diffusion layer region including a first impurity diffusion layer corresponding to the drain of the field effect transistor and a first diffusion resistance layer corresponding to the resistance element connected adjacent in a lateral direction to the first impurity diffusion layer.

According to the present invention, there is also provided a method of manufacturing an input protective circuit having a resistance element with one end connected to an input terminal of a semiconductor integrated circuit and the other end connected to an internal circuit, and a field effect transistor consisting of a source and drain for forming a channel between the other end of the resistance element and a reference voltage conductor and a gate covering the channel. The method comprises the steps of forming an element active region as a formation portion of the input protective circuit, forming the gate of the field effect transistor in the element active region, doping an impurity of a first conductivity type by using the gate as a mask to form a first impurity diffusion layer corresponding to the drain of the field effect transistor and a second impurity diffusion layer corresponding to the source, forming a mask layer having an opening corresponding to a formation region of the resistance element in the element active region, and doping an impurity of a second conductivity type opposite to the first conductivity type through the opening of the mask layer to form a diffusion resistance layer corresponding to the resistance element to be connected adjacent in a lateral direction to the first impurity diffusion layer.

According to the present invention, there is also provided a method of manufacturing an input protective circuit having a resistance element with one end connected to an input terminal of a semiconductor integrated circuit and the other end connected to an internal circuit, and a field effect transistor consisting of a source and drain for forming a channel between the other end of the resistance element and a reference voltage conductor and a gate covering the channel. The method comprises the steps of forming an element active region as a formation portion of the input protective circuit, forming the gate of the field effect transistor in the element active region, doping an impurity of a predetermined conductivity type by using the gate as a mask to form a diffusion resistance layer corresponding to the resistance element, forming a mask layer having openings corresponding to formation regions of first impurity diffusion layer corresponding to the drain of the field effect transistor and second impurity diffusion layer corresponding to the source in the element active region, and doping an impurity of the same conductivity type as the predetermined conductivity type through the openings of the mask layer to form the first impurity diffusion layer and the second impurity diffusion layer to overlap part of the diffusion resistance layer, with at least the first impurity diffusion layer being connected adjacent in a lateral direction to the diffusion resistance layer.

According to the present invention, there is provided a method of manufacturing an input protective circuit having a resistance element with one end connected to an input terminal of a semiconductor integrated circuit and the other end connected to an internal circuit, and a field effect transistor consisting of a source and drain for forming a channel between the other end of the resistance element and a reference voltage conductor and a gate covering the channel. The method comprises the steps of forming an element active region as a formation portion of the input protective circuit, forming the gate of the field effect transistor in the element active region, doping an impurity of a first conductivity type by using the gate as a mask to form a first impurity diffusion layer corresponding to the drain of the field effect transistor and a second impurity diffusion layer corresponding to the source, forming an insulating interlayer on an entire surface of the element active region, forming an opening corresponding to a formation region of the resistance element in the insulating interlayer, and doping an impurity of a second conductivity type opposite to the first conductivity type through the opening of the insulating interlayer to form a diffusion resistance layer corresponding to the resistance element to be connected adjacent in a lateral direction to the first impurity diffusion layer.

According to the present invention, there is provided a method of manufacturing an input protective circuit having a resistance element with one end connected to an input terminal of a semiconductor integrated circuit and the other end connected to an internal circuit, and a field effect transistor consisting of a source and drain for forming a channel between the other end of the resistance element and a reference voltage conductor and a gate covering the channel. The method comprises the steps of forming an element active region as a formation portion of the input protective circuit, forming the gate of the field effect transistor in the element active region, doping an impurity of a first conductivity type by using the gate as a mask to form a first impurity diffusion layer corresponding to the drain of the field effect transistor and a second impurity diffusion layer corresponding to the source, forming a mask layer having openings corresponding to formation regions of resistance elements in the element active region, doping an impurity of a second conductivity type opposite to the first conductivity type through the opening of the mask layer to form a first diffusion resistance layer corresponding to the resistance element to be connected adjacent in a lateral direction to the first impurity diffusion layer, and a second diffusion resistance layer corresponding to a resistance element to be connected to the gate of the field effect transistor, adjacent in a lateral direction to the second impurity diffusion layer, and forming a conductor for connecting one end of the second diffusion resistance layer to the gate of the field effect transistor.

According to the present invention, there is provided a semiconductor device comprising a gate structure including a gate electrode formed on a surface of a semiconductor substrate over an insulating film, and a pair of impurity diffusion layers formed in both side regions of said gate structure, wherein at least one of a pair of impurity diffusion layers has an extension region extended from a neighborhood of said gate structure, said extension region has a first layer and a second layer towards outside from the neighborhood of said gate structure, density of a first impurity of said first layer is different from density of a second impurity of said second layer, said first layer serves as a source or drain, and said second layer serves as a resistance element.

According to the present invention, there is provided a method of manufacturing a semiconductor device, comprising the steps of forming a gate structure including a gate electrode on a surface of a semicondutor substrate over a insulating film, doping a first impurity in both side regions of said gate structure by using said gate structure as a mask to form at least one of first sayers extending towards outside from the neighborhood of said gate structure, forming a mask layer covering said gate structure and a surface of said first layer and having an opening to expose a part of said first layer outside the neighbourhood of said gate structure, and doping a second impurity having a conductivity type opposite to said first impurity and different density with said first impurity through the opening of said mask layer to form a second layer adjacent to said first layer.

In the input protective circuit and the semiconductor device of the present invention, since the diffusion layer serving as the resistance element and the diffusion layer serving as the drain of the field effect transistor contact each other, no element isolation region for electrically isolating these diffusion layers from each other is required.

In the method of manufacturing the input protective circuit and the semiconductor device of the present invention, the diffusion layer serving as the resistance element or the diffusion layer serving as the drain is formed by double impurity ion implantation. Therefore, only one mask layer having an opening in the resistance element or drain formation region can be used, and two mask layers having openings in the respective formation regions need not be used.

BRIEF DESCRIPTION OF THE DRAWINGS

FIGS. 12A to 12D are schematic sectional views showing steps in manufacturing input protective circuit according to the fourth embodiment of the present invention.

DETAILED DESCRIPTION OF THE PREFERRED EMBODIMENTS

First Embodiment

Figure 1:
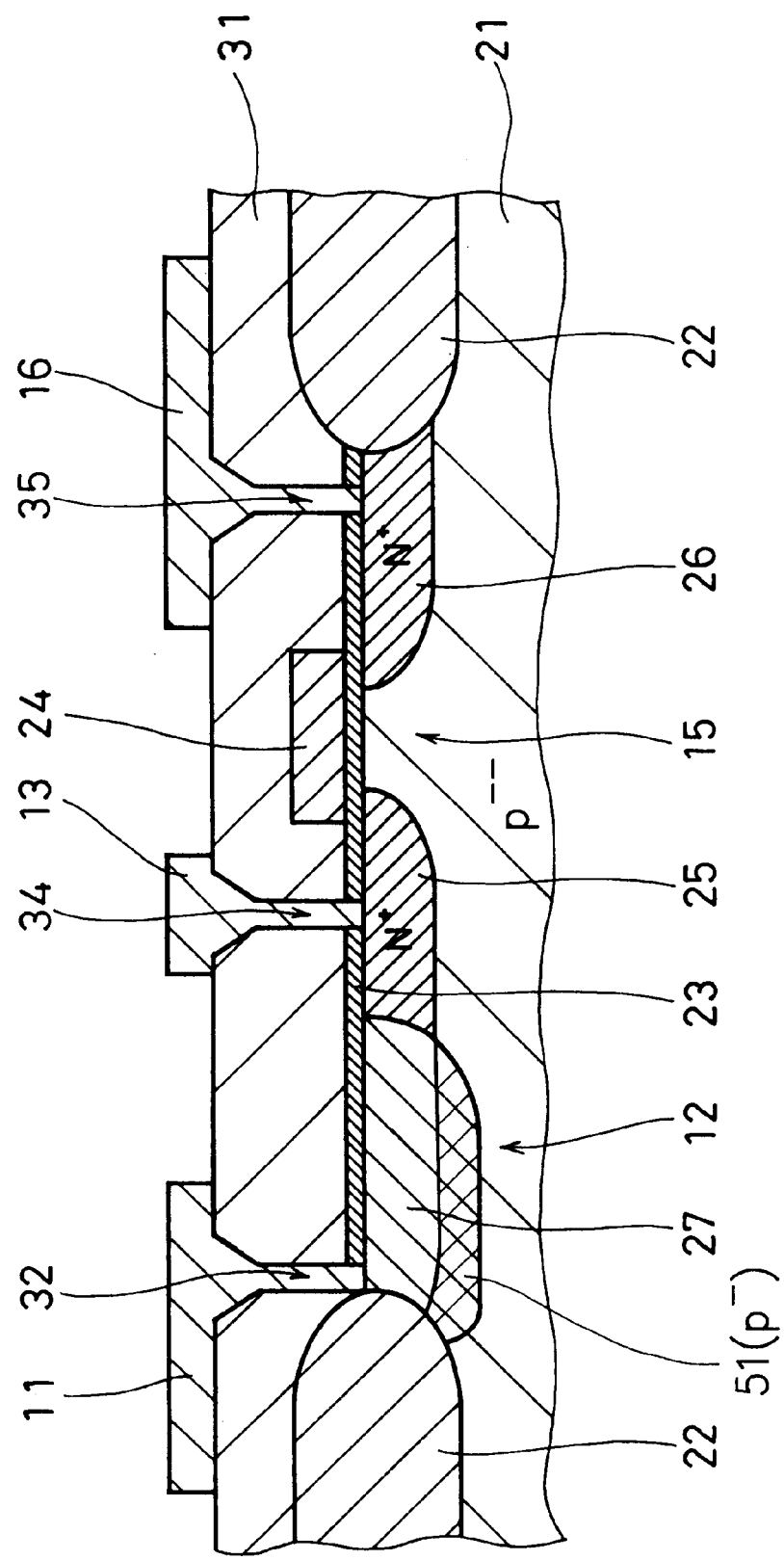
FIG. 1 is a schematic sectional view showing an input protective circuit according to the first embodiment of the present invention taken along a line I—I in FIG. 2.
Figure 2:
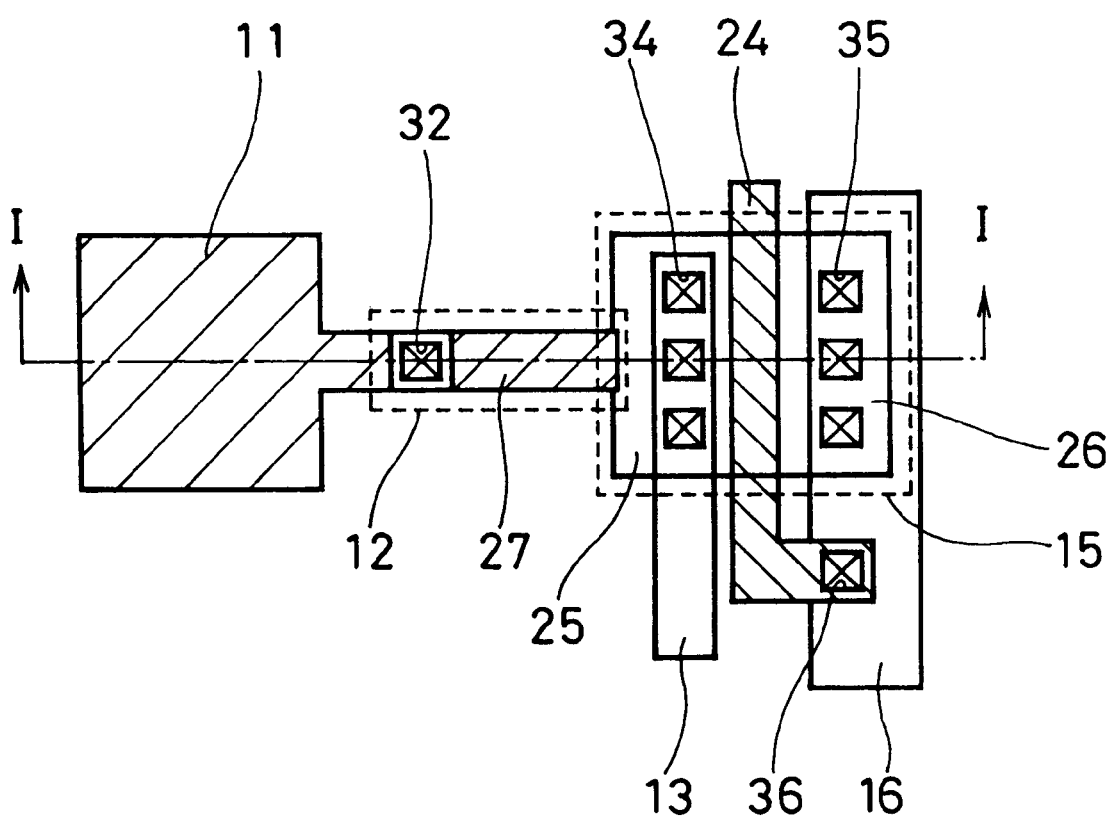
FIG. 2 is a schematic plan view showing the input protective circuit of the first embodiment.
Figure 3:
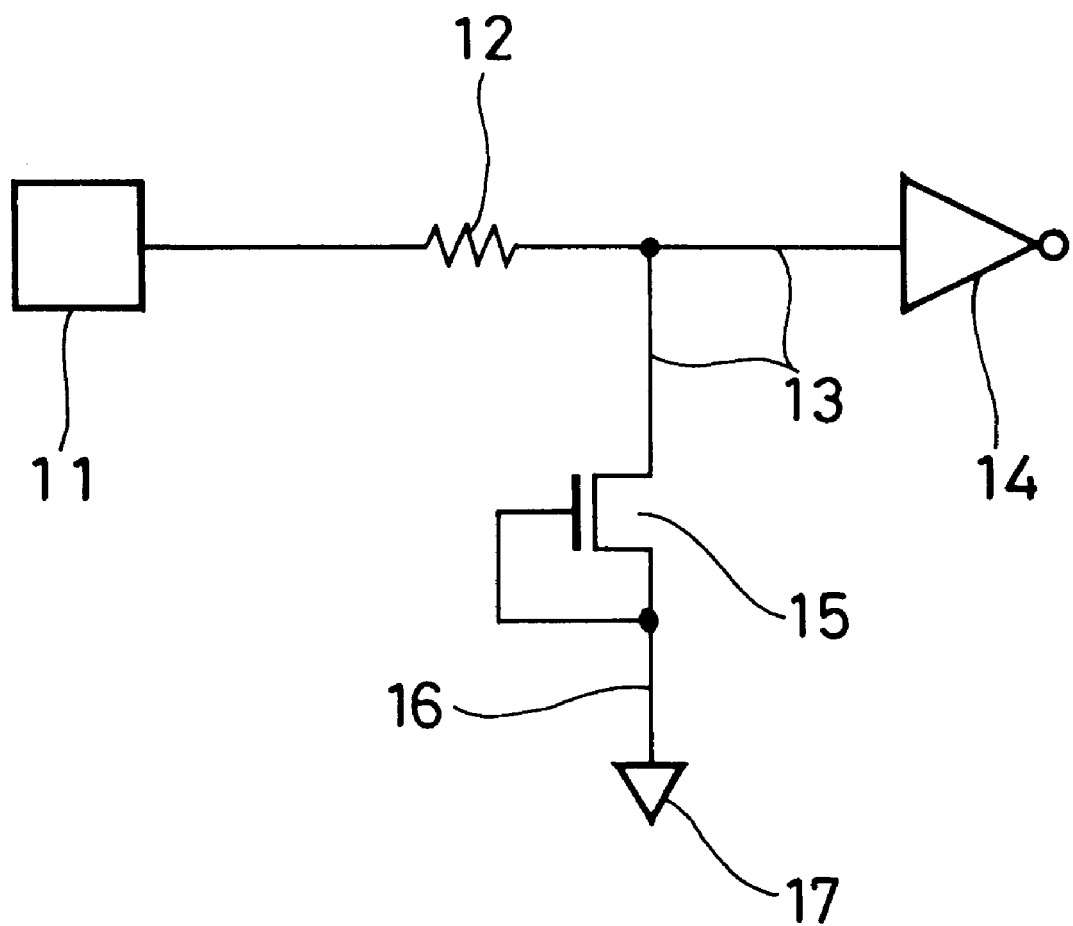
FIG. 3 is an equivalent circuit diagram of the input protective circuit of the first embodiment.

The first embodiment will be described first. FIG. 1 is a schematic sectional view of an input protective circuit of the first embodiment. FIG. 2 is a schematic plan view of the input protective circuit. FIG. 3 is an equivalent circuit diagram of the input protective circuit. FIGS. 4A to 4D are schematic sectional views showing steps in manufacturing the input protective circuit. In the first embodiment, the structure of the input protective circuit and a method of manufacturing the input protective circuit will be described together.

Figure 4A:
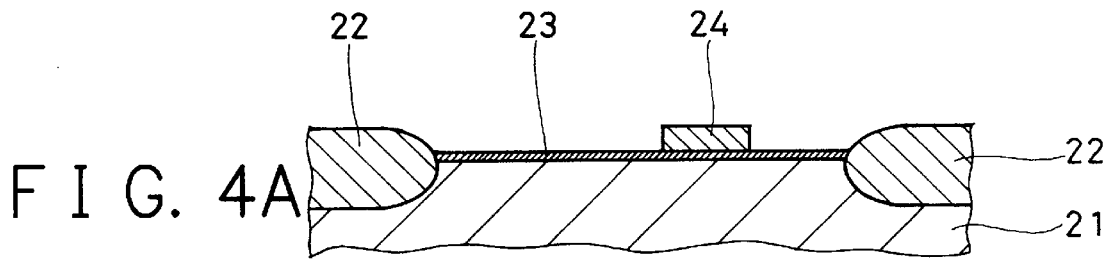
FIGS. 4A to 4D are schematic sectional views showing steps in manufacturing the input protective circuit according to the first embodiment of the present invention.

As shown in FIG. 4A, a silicon oxide film 22 serving as a field oxide film is formed on the surface of a $p^{--}$-type silicon substrate 21 by so-called LOCOS, thereby forming an element active region surrounded by the silicon oxide film 22. At this time, an element active region for a transistor 15 and an element active region for a resistance element 12 about 20 $\mu$m long and 10 $\mu$m wide are formed to contact each other.

A 170 Å thick silicon oxide film 23 serving as a gate oxide film is formed on the surface of the element active region by thermal oxidation. A polysilicon film 24 is deposited by CVD. This polysilicon film 24 is formed into a gate electrode pattern by photolithography and etching.

Figure 4B:
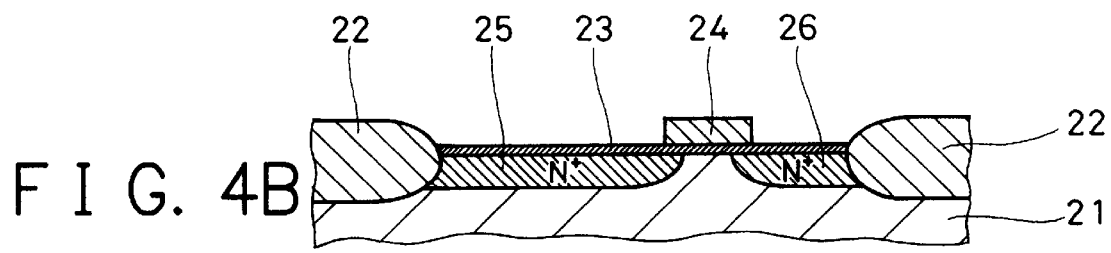

As shown in FIG. 4B, using the polysilicon film 24 and the silicon oxide film 22 as a mask, arsenic (As) ions are implanted at an acceleration energy of 80 keV with a dose of $1.0 \times 10^{16}$ cm$^{-2}$, thereby forming an n$^+$-type impurity diffusion layer 25 serving as the drain of the transistor 15 and an n$^+$-type impurity diffusion layer 26 serving as the source of the transistor 15.

Figure 4C:
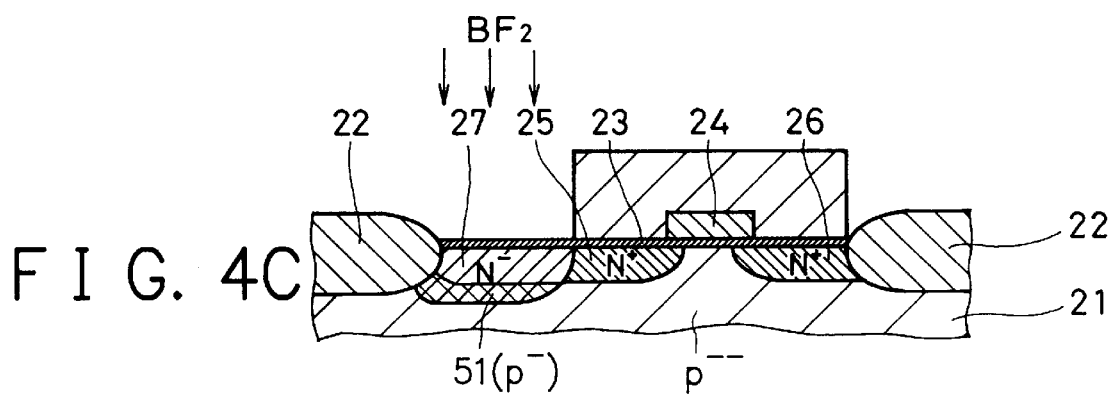

Next, as shown in FIG. 4C, using, as a mask, a photoresist having an opening just covering the region to form the resistance element 12 inside the single element active region for the transistor 15 and the resistance element 12, BF$_2$ ions are implanted at an acceleration energy of 40 keV with a dose of $6.0 \times 10^{15}$ cm$^{-2}$. As a result, the already implanted arsenic (As) ions are compensated with boron (B) ions so that an n$^-$-type diffusion resistance layer 27 serving as the resistance element 12 is formed. Note that BF$_2$ ions are implanted in the silicon substrate 21 over the impurity diffusion layer 25 so that a p$^-$-type impurity diffusion layer 51 is formed under the diffusion resistance layer 27 by only ion implantation of BF$_2$. Impurity density of the impurity diffusion layer 51 (p$^-$-type) is thicker than impurity density of the silicon substrate 21 (p$^{--}$-type). Thereafter, the photoresist is removed.

Figure 4D:
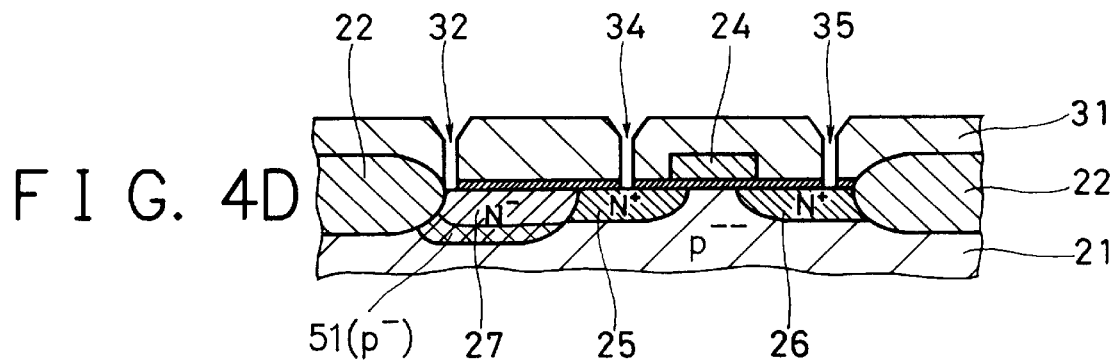

As shown in FIG. 4D, the polysilicon film 24 and the like are covered with an insulating interlayer 31, and the surface of the insulating interlayer 31 is planarized. A contact hole 32 reaching the end portion of the diffusion resistance layer 27 on the opposite side of the impurity diffusion layer 25, contact holes 34 and 35 reaching the impurity diffusion layers 25 and 26, respectively, and a contact hole 36 reaching the polysilicon film 24 are formed in the insulating interlayer 31 and the silicon oxide film 23.

In formation of these contact holes 32, 34, 35, and 36, wet etching using buffered hydrofluoric acid and subsequent anisotropic etching such as reactive ion etching are continuously performed to form a tapered opening portion, thereby preventing a degradation in step coverage in a metal film to be formed later.

As shown in FIG. 1, an about 100 $\mu$m square bonding pad 11 connected to one end portion of the diffusion resistance layer 27 through the about 2.0 $\mu$m wide contact hole 32, a wiring layer 13 connected to the impurity diffusion layer 25 through the contact hole 34 and extending toward an internal circuit 14, and a wiring layer 16 connected to the impurity diffusion layer 26 and the polysilicon film 24 through the contact holes 35 and 36, respectively, and extending toward a grounding supply 17 are formed with one metal layer. A surface protective film (not shown) or the like is formed, thereby completing the input protective circuit of the first embodiment.

According to the input protective circuit of the first embodiment, since the diffusion resistance layer 27 serving as the resistance element and the impurity diffusion layer 25 serving as the drain of the field effect transistor contact each other, no element isolation region for electrically isolating these diffusion layers from each other is required. For this reason, the semiconductor device can be further micropatterned.

In addition, according to the method of manufacturing the input protective circuit of the first embodiment, the diffusion resistance layer 27 serving as the resistance element and the impurity diffusion layer 25 serving as the drain are formed by performing double impurity ion implantation. In this method, only one mask layer (photoresist) having an opening in the formation region of the diffusion resistance layer 27 serving as the resistance element is used. Two mask layers having openings in the formation regions of the diffusion resistance layer 27 serving as the resistance element and the impurity diffusion layer 25 serving as the drain need not be used. Therefore, the process of manufacturing the input protective circuit can be simplified and shortened.

Second Embodiment

Figure 5:
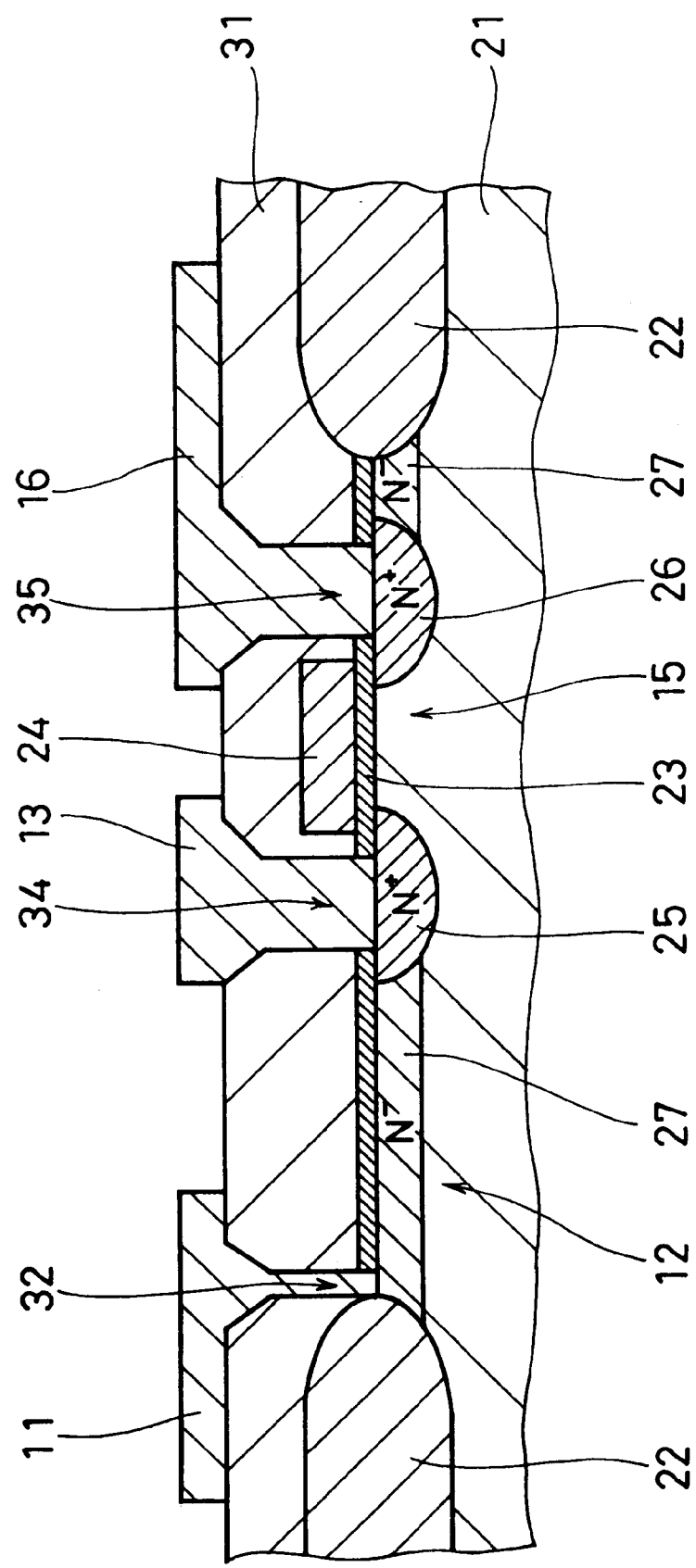
FIG. 5 is a schematic sectional view showing an input protective circuit according to the second embodiment of the present invention taken along a line II—II in FIG. 6.
Figure 6:
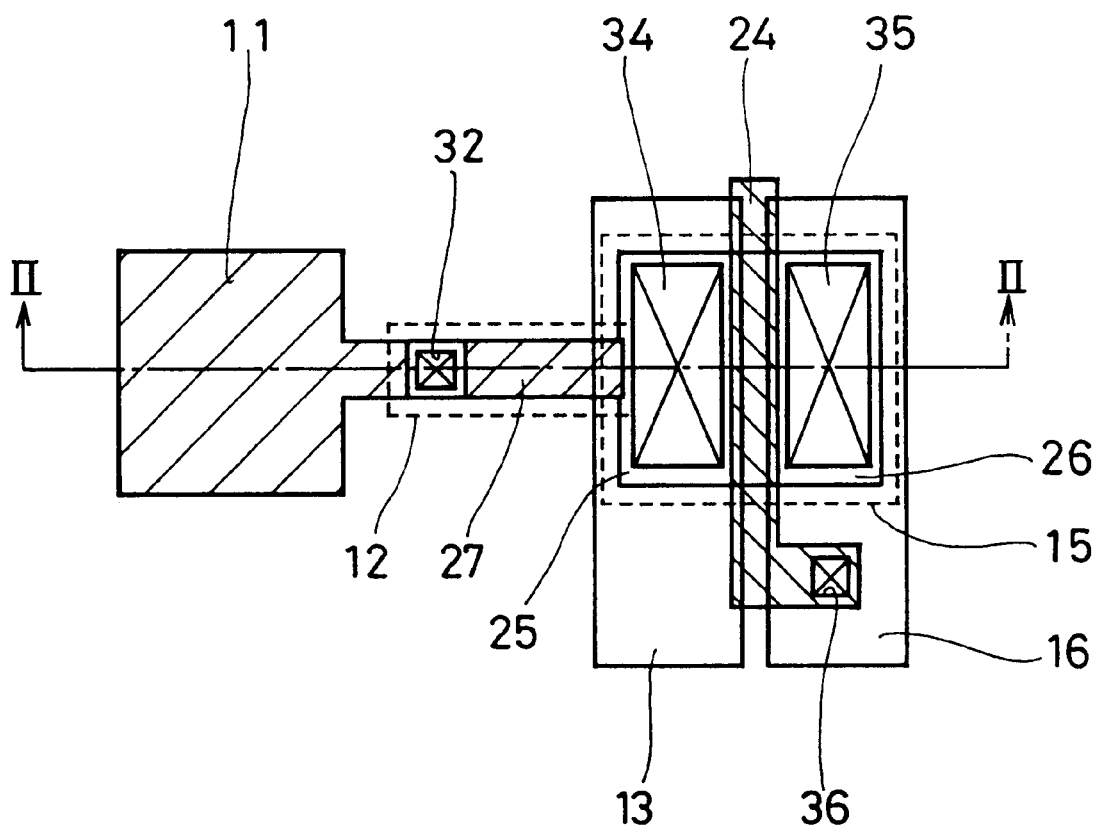
FIG. 6 is a schematic plan view showing the input protective circuit of the second embodiment.
Figure 7A:
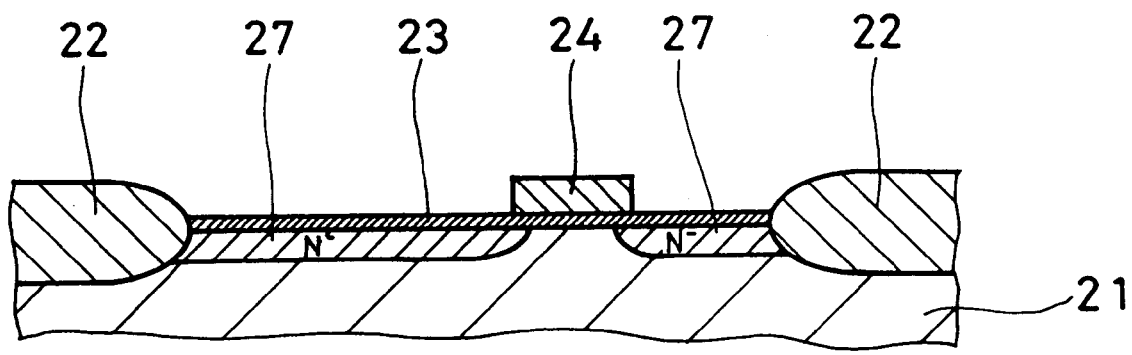
FIGS. 7A and 7B are schematic sectional views showing steps in manufacturing the input protective circuit according to the second embodiment of the present invention.
Figure 7B:
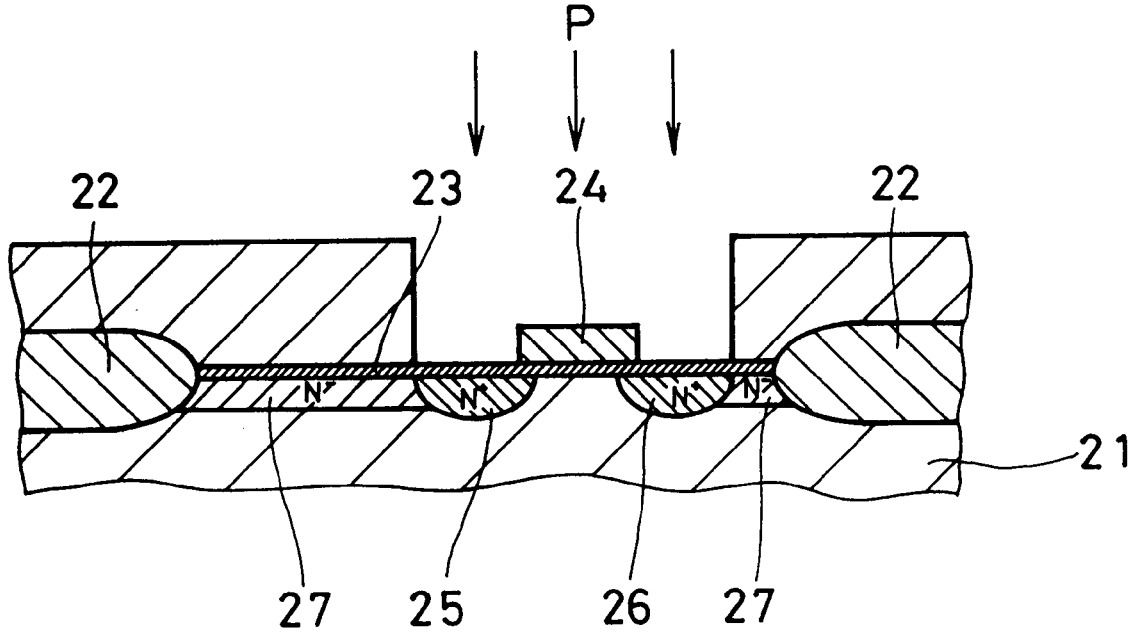

The second embodiment will be described next. FIG. 5 is a schematic sectional view of an input protective circuit of the second embodiment. FIG. 6 is a schematic plan view of the input protective circuit. FIGS. 7A and 7B are schematic sectional views showing steps in manufacturing the input protective circuit. The equivalent circuit diagram of this input protective circuit is the same as that shown in FIG. 3. In the second embodiment as well, the structure of the input protective circuit and a method of manufacturing the input protective circuit will be described together.

In manufacture of the input protective circuit of the second embodiment, substantially the same process as in manufacture of the input protective circuit of the first embodiment shown in FIGS. 1 to 4 is executed until a polysilicon film 24 is formed into a gate electrode pattern.

In the second embodiment, however, as shown in FIG. 7A, using the polysilicon film 24 and a silicon oxide film 22 as a mask, phosphorus (P) ions are implanted at an acceleration energy of 80 keV with a dose of $2.0 \times 10^{13}$ cm$^{-2}$, thereby forming an n$^-$-type diffusion resistance layer 27 serving as a resistance element 12.

Next, as shown in FIG. 7B, using, as a mask, a photoresist having an opening just covering a region to form a transistor 15 inside the single element active region for the transistor 15 and the resistance element 12, phosphorus (P) ions are implanted at an acceleration energy of 80 keV with a dose of $1.0 \times 10^{16}$ cm$^{-2}$. As a result, phosphorus ions are added to the already implanted phosphorus ions so that an n$^+$-type impurity diffusion layer 25 serving as the drain of the transistor 15 and an n$^+$-type impurity diffusion layer 26 serving as the source of the transistor 15 are formed. Thereafter, the photoresist film is removed.

The photoresist used as a mask for ion implantation may have an opening corresponding to a contact hole 32. In this case, the connection resistance between the n$^-$-type diffusion resistance layer 27 and a bonding pad 11 in the contact hole 32 can be lowered.

As a process subsequent to formation of an insulating interlayer 31, substantially the same process as that of manufacture of the input protective circuit of the first embodiment shown in FIGS. 1 to 4 is executed, thereby completing the input protective circuit of the second embodiment.

According to the input protective circuit of the second embodiment, since the diffusion resistance layer 27 serving as the resistance element and the impurity diffusion layer 25 serving as the drain of the field effect transistor contact each other, no element isolation region for electrically isolating these diffusion layers from each other is required. For this reason, the semiconductor device can be further micropatterned.

In addition, according to the method of manufacturing the input protective circuit of the second embodiment, the diffusion resistance layer 27 serving as the resistance element and the impurity diffusion layers 25 and 26 serving as the drain and the source are formed by performing double impurity ion implantation. In this method, only one mask layer (photoresist) having an opening in the formation region of the impurity diffusion layers 25 and 26 is used. Two mask layers having openings in the formation regions of the diffusion resistance layer 27 serving as the resistance element and the impurity diffusion layer 25 serving as the drain need not be used. Therefore, the process of manufacturing the input protective circuit can be simplified and shortened.

Third Embodiment

The third embodiment will be described next. FIGS. 8A to 8D are schematic sectional views showing steps in manufacturing an input protective circuit of the third embodiment. The equivalent circuit diagram of this input protective circuit is the same as that shown in FIG. 3. In the third embodiment as well, the structure of the input protective circuit and a method of manufacturing the input protective circuit will be described together.

Figure 8A:
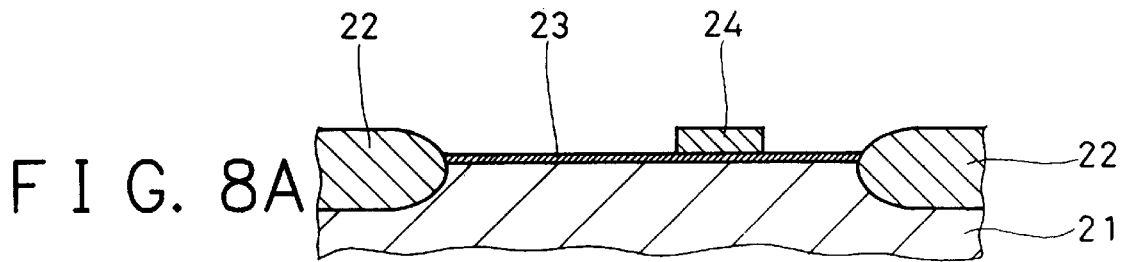
FIGS. 8A to 8D are schematic sectional views showing steps in manufacturing an input protective circuit according to the third embodiment of the present invention.

As shown in FIG. 8A, a silicon oxide film 22 serving as a field oxide film is formed on the surface of a p$^{--}$-type silicon substrate 21 by LOCOS, thereby forming an element active region surrounded by the silicon oxide film 22. At this time, an element active region for a transistor 15 and an element active region for a resistance element 12 about 20 $\mu$m long and 10 $\mu$m wide are formed to contact each other.

A 170 Å thick silicon oxide film 23 serving as a gate oxide film is formed on the surface of the element active region by thermal oxidation. A polysilicon film 24 is deposited by CVD. This polysilicon film 24 is formed into a gate electrode pattern by photolithography and etching.

Figure 8B:
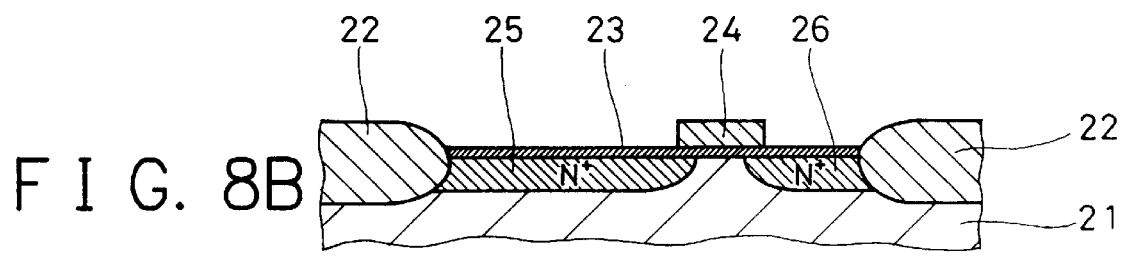

As shown in FIG. 8B, using the polysilicon film 24 and the silicon oxide film 22 as a mask, arsenic (As) ions are implanted at an acceleration energy of 80 keV with a dose of $1.0 \times 10^{16}$ cm$^{-2}$, thereby forming an n$^+$-type impurity diffusion layer 25 serving as the drain of the transistor 15 and an n$^+$-type impurity diffusion layer 26 serving as the source of the transistor 15.

Figure 8C:
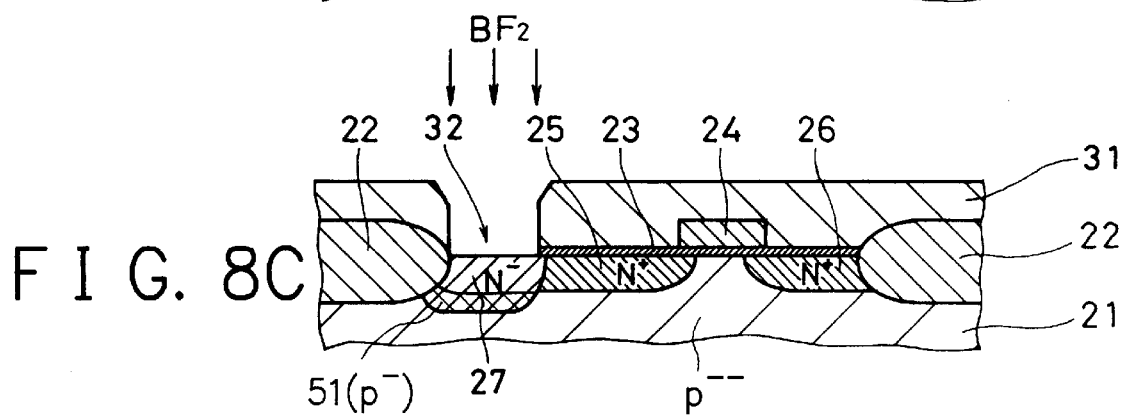

Next, as shown in FIG. 8C, an insulating interlayer 31 is formed on the entire surface of the substrate 21, and thereafter, an opening portion 32 corresponding to just a formation region to form a resistance element 12 inside the single element active region is formed in the insulating interlayer 31. BF$_2$ ions are implanted in the substrate 21 as the bottom surface of the opening portion 32 at an acceleration energy of 40 kev with a dose of $6.0 \times 10^{15}$ cm$^{-2}$. As a result, the already implanted As ions are compensated with B ions so that an n$^-$-type diffusion resistance layer 27 serving as the resistance element 12 is formed. Note that BF$_2$ ions are implanted in the silicon substrate 21 over the impurity diffusion layer 25 so that a p$^-$-type impurity diffusion layer 51 is formed under the diffusion resistance layer 27 by only ion implantation of BF$_2$. Impurity density of the impurity diffusion layer 51 (p$^-$-type) is thicker than impurity density of the silicon substrate 21 (p$^{--}$-type).

Figure 8D:
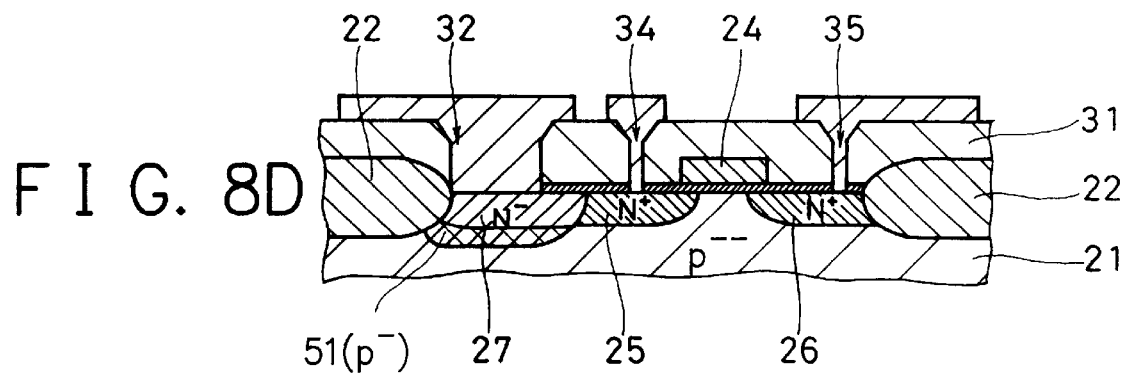

As shown in FIG. 8D, contact holes 34 and 35 reaching the impurity diffusion layers 25 and 26, respectively, and a contact hole 36 reaching the polysilicon film 24 are formed in the insulating interlayer 31 and the silicon oxide film 23.

In formation of these contact holes 32, 34, 35, and 36, wet etching using buffered hydrofluoric acid and subsequent anisotropic etching such as reactive ion etching are continuously performed to form a tapered opening portion, thereby preventing a degradation in step coverage in a metal film to be formed later.

An about 100 $\mu$m square bonding pad 11 connected to one end portion of the diffusion resistance layer 27 through the contact hole 32, a wiring layer 13 connected to the impurity diffusion layer 25 through the contact hole 34 and extending toward an internal circuit 14, and a wiring layer 16 connected to the impurity diffusion layer 26 and the polysilicon film 24 through the contact holes 35 and 36, respectively, and extending toward a grounding supply 17 are formed from one metal layer. A surface protective film (not shown) or the like is formed, thereby completing the input protective circuit of the third embodiment.

According to the input protective circuit of the third embodiment, since the diffusion resistance layer 27 serving as the resistance element and the impurity diffusion layer 25 serving as the drain of the field effect transistor contact each other, no element isolation region for electrically isolating these diffusion layers from each other is required. For this reason, the semiconductor device can be further micropatterned.

In addition, according to the method of manufacturing the input protective circuit of the third embodiment, the diffusion resistance layer 27 serving as the resistance element and the impurity diffusion layer 25 serving as the drain are formed by performing double impurity ion implantation. In this method, only one mask layer (insulating interlayer 31) having an opening in the formation region of the diffusion resistance layer 27 serving as the resistance element is used. Two mask layers having openings in the formation regions of the diffusion resistance layer 27 and the impurity diffusion layer 25 need not be used. Therefore, the process of manufacturing the input protective circuit can be simplified and shortened.

Fourth Embodiment

Figure 9:
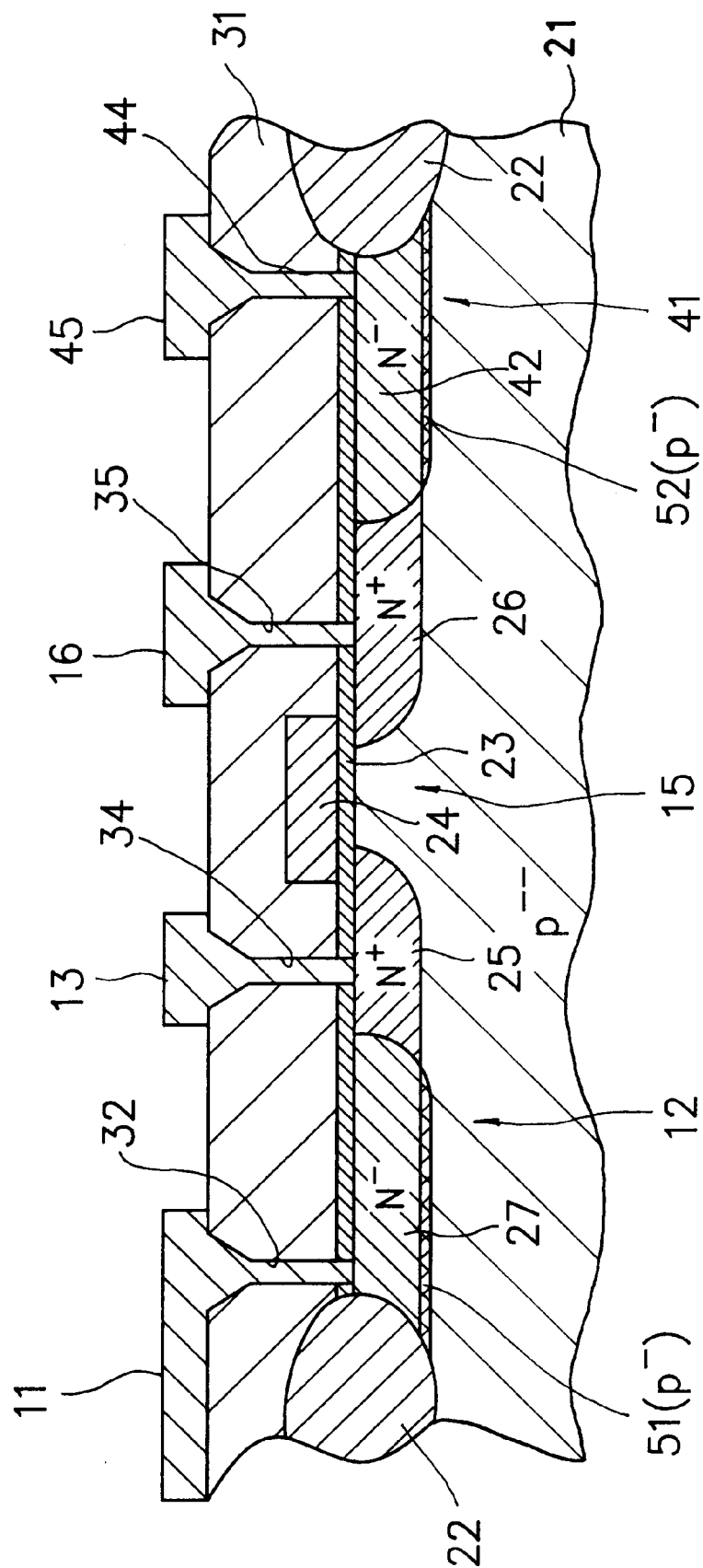
FIG. 9 is a schematic sectional view showing an input protective circuit according to the fourth embodiment of the present invention taken along a line III—III in FIG. 10.
Figure 10:
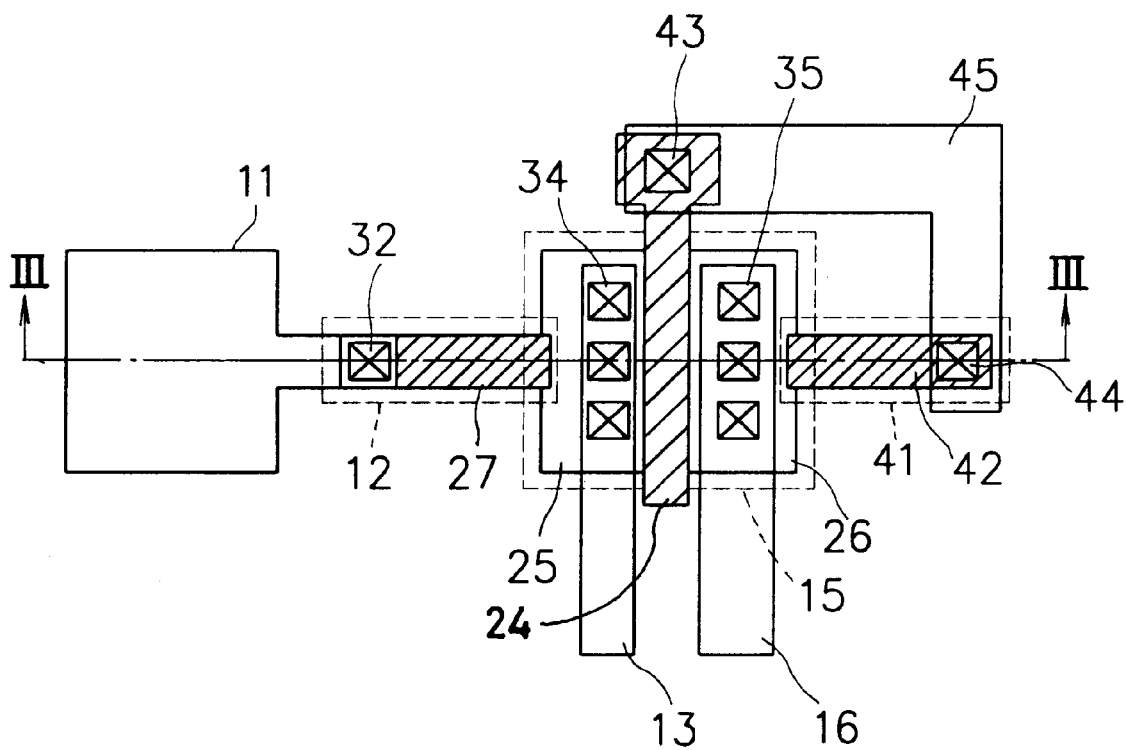
FIG. 10 is a schematic plan view showing the input protective circuit of the fourth embodiment.
Figure 11:
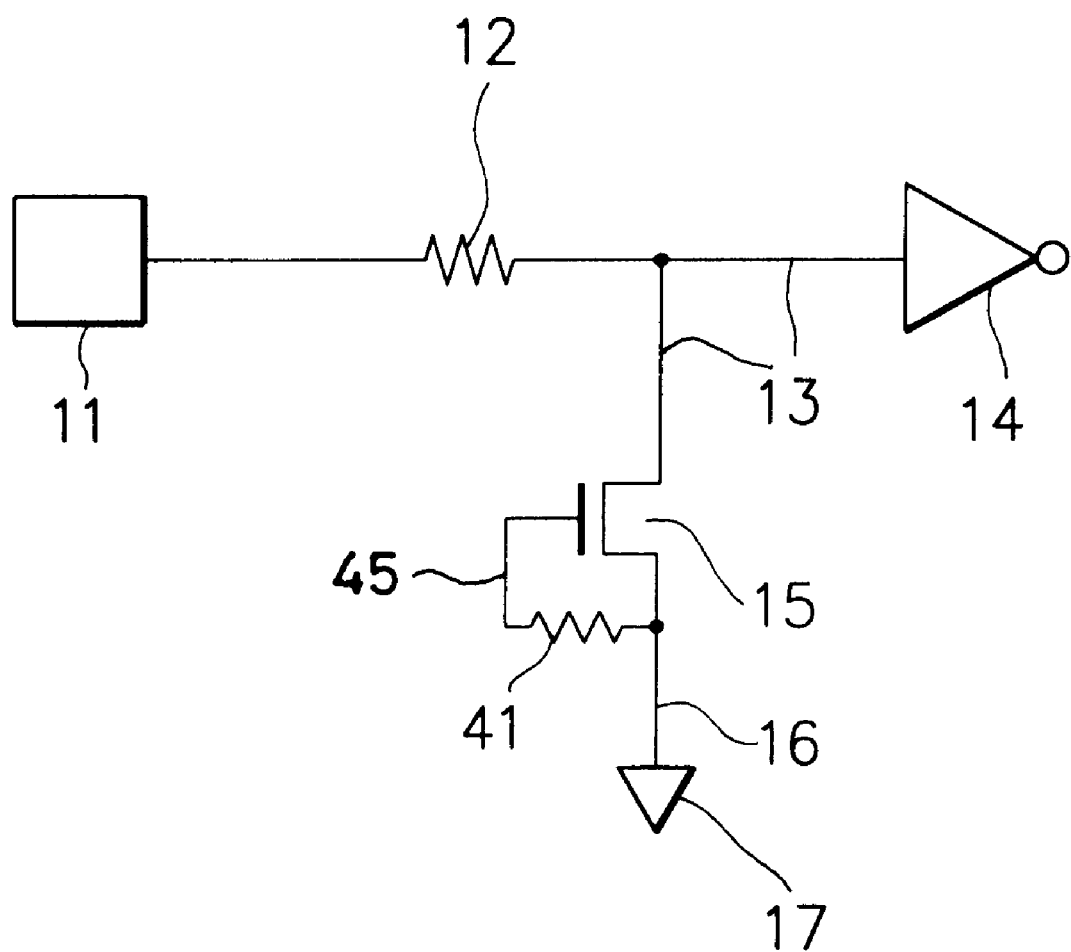
FIG. 11 is an equivalent circuit diagram of the input protective circuit of the fourth embodiment.

The fourth embodiment will be described next. FIG. 9 is a schematic sectional view of an input protective circuit of the fourth embodiment. FIG. 10 is a schematic plan view of the input protective circuit. FIG. 11 is an equivalent circuit diagram of the input protective circuit. FIGS. 12A to 12D are schematic sectional views showing steps in manufacturing the input protective circuit. In the fourth embodiment as well, the structure of the input protective circuit and a method of manufacturing the input protective circuit will be described together.

As shown in FIG. 12A, a silicon oxide film 22 serving as a field oxide film is formed on the surface of a p$^{---}$-type silicon substrate 21 by so-called LOCOS, thereby forming an element active region surrounded by the silicon oxide film 22. At this time, an element active region for a transistor 15 and element active regions for resistance elements 12 and 41 about 20 µm long and 10 µm wide are formed to contact each other.

A 170 Å thick silicon oxide film 23 serving as a gate oxide film is formed on the surface of the element active region by thermal oxidation. A polysilicon film 24 is deposited by CVD. This polysilicon film 24 is formed into a gate electrode pattern by photolithography and etching.

As shown in FIG. 12B, using the polysilicon film 24 and the silicon oxide film 22 as a mask, arsenic (As) ions are implanted at an acceleration energy of 80 kev with a dose of $1.0 \times 10^{16}$ cm$^{-2}$, thereby forming an n$^+$-type impurity diffusion layer 25 serving as the drain of the transistor 15 and an n$^+$-type impurity diffusion layer 26 serving as the source of the transistor 15.

Next, as shown in FIG. 12C, using, as a mask, a photoresist having openings just covering formation regions to form the resistance elements 12 and 41 inside the single element active region for the transistor 15 and the resistance elements 12 and 41, BF$_2$ ions are implanted at an acceleration energy of 40 keV with a dose of $6.0 \times 10^{15}$ cm$^{-2}$. As a result, the already implanted arsenic (As) ions are compensated with boron (B) ions so that an n$^-$-type diffusion resistance layer 27 serving as the resistance element 12 is formed to contact the n$^+$-type impurity diffusion layer 25 serving as the drain, and simultaneously, an n$^-$-type diffusion resistance layer 42 serving as the resistance element 41 is formed between the impurity diffusion layer 26 and the polysilicon film (gate electrode) 24 to contact the n$^+$-type impurity diffusion layer 26 serving as the source. Note that BF$_2$ ions are implanted in the silicon substrate 21 over the impurity diffusion layers 25 and 26 so that a p$^-$-type impurity diffusion layers 51 and 52 are respectively formed under the diffusion resistance layers 27 and 42 by only ion implantation of BF$_2$. Impurity density of the impurity diffusion layers 51 and 52 (p$^-$-type) are thicker than impurity density of the silicon substrate 21 (p$^{---}$-type). Thereafter, the photoresist is removed.

As shown in FIG. 12D, the polysilicon film 24 and the like are covered with an insulating interlayer 31, and the surface of the insulating interlayer 31 is planarized. A contact hole 32 reaching the diffusion resistance layer 27 at the opposite end to the impurity diffusion layer 25, contact holes 34 and 35 reaching the impurity diffusion layers 25 and 26, respectively, a contact hole 44 reaching the diffusion resistance layer 42, and a contact hole 43 reaching the polysilicon film 24 are formed in the insulating interlayer 31 and the silicon oxide film 23.

In formation of these contact holes 32, 34, 35, 43, and 44, wet etching using buffered hydrofluoric acid and subsequent anisotropic etching such as reactive ion etching are continuously performed to form a tapered opening portion, thereby preventing a degradation in step coverage in a metal film to be formed later.

As shown in FIG. 9, an about 100 µm square bonding pad 11 connected to one end portion of the diffusion resistance layer 27 through the about 2.0 µm wide contact hole 32, a wiring layer 13 connected to the impurity diffusion layer 25 through the contact hole 34 and extending toward an internal circuit 14, a wiring layer 16 connected to the impurity diffusion layer 26 through the contact hole 35 and extending toward the grounding supply 17, and a wiring layer 45 connected to the polysilicon film 24 and the diffusion resistance layer 42 through the contact holes 43 and 44, respectively, are formed with a single metal layer. A surface protective film (not shown) or the like is formed, thereby completing the input protective circuit of the fourth embodiment.

According to the input protective circuit of the fourth embodiment, since the diffusion resistance layer 27 serving as the resistance element and the impurity diffusion layer 25 serving as the drain of the field effect transistor contact each other, no element isolation region for electrically isolating these diffusion layers from each other is required. For this reason, the semiconductor device can be further micropatterned.

In addition, according to the method of manufacturing the input protective circuit of the fourth embodiment, the diffusion resistance layers 27 and 42 serving as the resistance elements and the impurity diffusion layers 25 and 26 serving as the drain and the source are formed by performing double impurity ion implantation. In this method, only one mask layer (photoresist) having openings in the formation regions of the diffusion resistance layers 27 and 42 serving as the resistance elements is used. Two mask layers having openings in the formation regions of the diffusion resistance layers 27 and 42 and the impurity diffusion layers 25 and 26 need not be used. Therefore, the process of manufacturing the input protective circuit can be simplified and shortened.

As has been described above, in the input protective circuit of the present invention, since no element isolation region for electrically isolating the diffusion resistance layer serving as the resistance element and the impurity diffusion layer serving as the drain of the field effect transistor is required, the area necessary for the input protective circuit can be made small, so that the semiconductor integrated circuit can be micropatterned.

According to the method of manufacturing the input protective circuit of the present invention, only one mask layer having an opening in the formation region of the resistance element or drain is used. Two mask layers having openings in the respective formation regions need not be used. Therefore, the input protective circuit can be formed with a small number of processes, so that a semiconductor integrated circuit or the like can be manufactured at a low cost.

What is claimed is:

1. An input protective circuit having a resistance element with one end connected to an input terminal of a semiconductor integrated circuit and the other end connected to an internal circuit, and a field effect transistor consisting of a source and drain for forming a channel between the other end of said resistance element and a reference voltage conductor and a gate covering said channel, comprising:

a first diffusion layer region including a first impurity diffusion layer corresponding to said drain of said field effect transistor and a first diffusion resistance layer corresponding to said resistance element adjacent said first impurity diffusion layer;

a second diffusion layer region including a second impurity diffusion layer corresponding to said source of said field effect transistor and a second diffusion resistance layer adjacent said second impurity diffusion layer, and a conductor for connecting an end portion of said second diffusion resistance layer to said gate.

2. A circuit according to claim 1, wherein said first diffusion resistance layer and said first impurity diffusion layer are formed to have the same conductivity type and different conductivities.

3. A circuit according to claim 1, wherein said semiconductor integrated circuit is formed on a p-type semiconductor substrate, said first impurity diffusion layer is of an $n^+$ type, and said first diffusion resistance layer is of an $n^-$ type.

4. A circuit according to claim 1, wherein said input protective circuit is formed in a single element active region.

5. A circuit according to claim 1, wherein said gate of said field effect transistor is connected to said reference voltage conductor.

6. A circuit according to claim 1, wherein said second diffusion resistance layer and said second impurity diffusion layer are formed to have the same conductivity type and different conductivities.

7. A circuit according to claim 1, wherein said semiconductor integrated circuit is formed on a p-type semiconductor substrate, said second impurity diffusion layer is of an $n^+$ type, and said second diffusion resistance layer is of an $n^-$ type.

* * * * *